United States Patent
Roesch

(10) Patent No.: US 11,531,272 B2
(45) Date of Patent: Dec. 20, 2022

(54) PUPIL STOP FOR AN ILLUMINATION OPTICAL UNIT OF A METROLOGY SYSTEM

(71) Applicant: Carl Zeiss SMT GmbH, Oberkochen (DE)

(72) Inventor: Matthias Roesch, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/724,701

(22) Filed: Apr. 20, 2022

(65) Prior Publication Data

US 2022/0342317 A1   Oct. 27, 2022

(30) Foreign Application Priority Data

Apr. 21, 2021   (DE) .................. 102021203961.8

(51) Int. Cl.
*G03F 7/20*   (2006.01)

(52) U.S. Cl.
CPC ...... *G03F 7/70133* (2013.01); *G03F 7/70591* (2013.01)

(58) Field of Classification Search
CPC ................. G03F 7/70133; G03F 7/70591
See application file for complete search history.

(56) References Cited

U.S. PATENT DOCUMENTS

| | | | |
|---|---|---|---|
| 9,176,390 B2 | 11/2015 | Layh et al. | |
| 2009/0086183 A1 | 4/2009 | Shiode | |
| 2009/0213355 A1 | 8/2009 | Kajiyama | |
| 2013/0250265 A1* | 9/2013 | Bienert | G03F 7/70091 355/71 |
| 2015/0042974 A1 | 2/2015 | Zimmermann | |
| 2016/0299433 A1 | 10/2016 | Liou et al. | |
| 2017/0131528 A1 | 5/2017 | Ruoff et al. | |
| 2017/0132782 A1 | 5/2017 | Matejka et al. | |

FOREIGN PATENT DOCUMENTS

| | | | | |
|---|---|---|---|---|
| WO | WO 2012/028303 | 3/2012 | ............. | G03F 7/20 |
| WO | WO 2016/012425 | 1/2016 | ............. | G02B 17/08 |
| WO | WO 2016/012426 | 1/2016 | ............. | G02B 17/08 |

OTHER PUBLICATIONS

The Examination Report issued by the German Patent Office for Application No. DE 102021203961.8, dated Oct. 27, 2021 (with English Translation).

* cited by examiner

*Primary Examiner* — Peter B Kim
(74) *Attorney, Agent, or Firm* — Fish & Richardson P.C.

(57) ABSTRACT

A pupil stop serves for use in an illumination optical unit of a metrology system for determining, as a result of illumination and imaging under illumination and imaging conditions corresponding to those of an optical production system, an aerial image of an object to be measured. The pupil stop has two pole passage openings for specifying a respective pole of an illumination of the illumination optical unit specified by the pupil stop. In each case at least one stop web passes through the respective pole passage opening and consequently divides the pole passage opening into a plurality of partial pole openings. This yields a pupil stop with which an accuracy of a convergence of the illumination and imaging conditions of the optical production system to the illumination and imaging conditions of the optical measurement system can be improved.

20 Claims, 3 Drawing Sheets

PUPIL STOP FOR AN ILLUMINATION OPTICAL UNIT OF A METROLOGY SYSTEM

CROSS-REFERENCE TO RELATED APPLICATIONS

This application claims priority under 35 U.S.C. § 119 from German Application No. 10 2021 203 961.8, filed, on Apr. 21, 2021, the entire contents of which are incorporated herein by reference.

TECHNICAL FIELD

The invention relates to a pupil stop for an illumination optical unit of a metrology system for determining, as a result of illumination and imaging under illumination and imaging conditions corresponding to those of an optical production system, an aerial image of an object to be measured. Further, the invention relates to an illumination optical unit for such a metrology system comprising such a pupil stop, and to such a metrology system comprising such an illumination optical unit.

BACKGROUND

A metrology system is known from US 2017/0131528 A1 (parallel document WO 2016/012425 A2), from WO 2016/012426 A1 and from US 2017/0132782 A1.

SUMMARY

It is an aspect of the present invention to improve an accuracy of a convergence of illumination and imaging conditions of an optical production system to illumination and imaging conditions of an optical measurement system, which can be part of a metrology system, in particular, particularly when using a multipole illumination setting.

According to the invention, this aspect is achieved by a convergence method having the features specified in Claim 1.

A multipole illumination setting is frequently used in the context of mask exposure in projection lithography. Corresponding multipole illumination situations therefore require implementation of a metrology of correspondingly exposed objects with a high accuracy, that is to say, in particular, with a good convergence of the metrology imaging and illumination conditions to the production imaging and illumination conditions.

Surprisingly, a pupil stop with in each case at least one stop web in the respective pole passage opening was identified as improving a convergence of a metrology illumination setting to a correspondingly multi-pole production illumination setting, even though pole shadowing corresponding to such webs need not be present in the production illumination setting. A transverse dimension of the stop web across its web extension can be small as compared to a typical transverse dimension of a stop area between adjacent pole passage openings of the pupil stop. For example, such stop web transverse dimension can be no more than 50% of such typical stop area transverse dimension.

In some implementations, the stop web can have a constant transverse dimension across its web extension.

Parameters decisive for metrology, for instance especially the parameter values of NILS (normalized image log slope, derivative of an aerial image intensity curve at an edge position of an imaged structure) and CD (critical dimension), can be adapted in metrology to match the corresponding parameters of the production system well.

The two pole passage openings of the pupil stop may be spaced apart from one another along a pole direction. This pole direction may extend parallel to a direction perpendicular to an object displacement direction of a production projection exposure apparatus, to the illumination setting of which the metrology illumination setting is intended to converge. If an object plane of the production projection exposure apparatus is spanned by coordinates x and y and an object displacement direction extends along the y-coordinate, the pupil stop according to the invention may thus be realized for example as an x-dipole pupil stop or else as a C-quad pupil stop (superposition of an x-dipole and a y-dipole). Such a quadrupole superposition of two dipoles in the x- and y-directions is also known as a C-quad (cf. WO 2012/028303 A1; in particular FIG. 3a).

Pupil stops specifying a different number of poles to two (e.g., x-dipole) or four (e.g., C-quad) are also possible, for example three poles, five poles or more than five poles, for example six poles or eight poles. At least two of these poles, which in turn are each subdivided into a plurality of partial pole openings, can be spaced apart from one another along the x-coordinate.

Alternatively or in addition, the pupil stop can be arranged such that two poles of the illumination setting, as specified by the pupil stop, specify a dipole with a dipole direction, that is to say a direction along a spacing between the two poles of the dipole, which extends perpendicular to the object structures of the object to be measured.

A symmetric stop web arrangement according to Claim 2 was found to be particularly advantageous for a good convergence to the illumination and imaging conditions. The center of the pupil stop can correspond to a pupil center of an illumination optical unit when the pupil stop is arranged in said illumination optical unit.

Exactly one stop web per pole passage opening according to Claim 3 has proven its worth in practice.

Directions of extent of the stop webs according to Claims 4 and 5 may ensure, in particular, a good convergence to measurement parameters relating to the imaging of vertical object structures, that is to say structures with a structure alignment perpendicular to a dipole direction of a dipole, which is specified by two poles of the multi-pole illumination specified by way of the pupil stop. In this case, the dipole direction is the direction along a distance between the two poles of the dipole.

The advantages of an illumination optical unit according to Claim 6 and a metrology system according to Claim 7 correspond to those which were already explained above with reference to the pupil stop.

These advantages take effect, in particular, in the case of a metrology system comprising an imaging optical unit with a large image-side numerical aperture according to Claim 8.

The metrology system can be used to measure a lithography mask provided for projection exposure for producing semiconductor components with very high structure resolution, which is better than 30 nm, for example, and which can be better than 10 nm, in particular.

The metrology system can comprise a quick-change tool holder for replacing the respective dipole pupil stop with a change stop for specifying a selectable measurement illumination setting. This increases the flexibility of the metrology system.

BRIEF DESCRIPTION OF DRAWINGS

An exemplary embodiment of the invention is explained in greater detail below with reference to the drawings. In said drawings.

DETAILED DESCRIPTION

Figure 1:
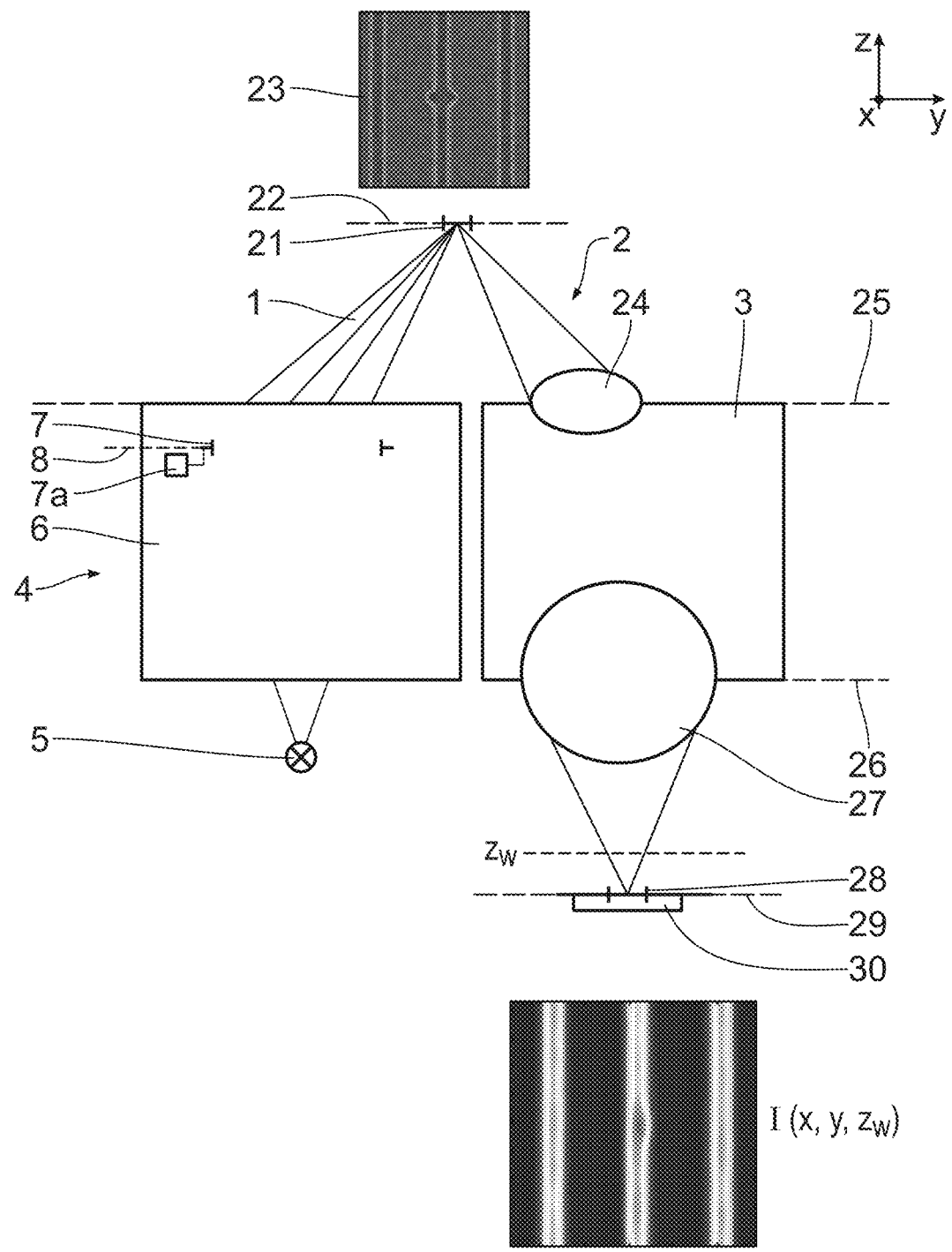
FIG. 1 schematically shows a metrology system for determining, as a result of illumination and imaging under illumination and imaging conditions corresponding to those of an optical production system, a production aerial image of an object to be measured, with a plan view of an object field and a plan view of a measurement field in a current z-position additionally being shown.

FIG. 1 shows, in a plane corresponding to a meridional section, a beam path of EUV illumination light or EUV imaging light 1 in a metrology system 2 with an imaging optical unit 3, which is schematically reproduced by a box in FIG. 1. The illumination light 1 is generated in an illumination system 4 of the projection exposure apparatus 2.

In order to facilitate the representation of positional relationships, a Cartesian xyz-coordinate system is used hereinafter. The x-axis in FIG. 1 extends perpendicular to the plane of the drawing and out of the latter. The y-axis in FIG. 1 extends toward the right. The z-axis in FIG. 1 extends upwardly.

The illumination system 4 includes an EUV light source 5 and an illumination optical unit 6, depicted schematically in each case. The light source can be a laser plasma source (LPP; laser produced plasma) or a discharge source (DPP; discharge produced plasma). In principle, a synchrotron-based light source can also be used, for example a free electron laser (FEL). A used wavelength of the illumination light 1 can lie in the range of between 5 nm and 30 nm. In principle, in the case of a variant of the projection exposure apparatus 2, it is also possible to use a light source for another used light wavelength, for example for a used wavelength of 193 nm.

The illumination light 1 is conditioned in the illumination optical unit 6 of the illumination system 4 such that a specific illumination setting of the illumination is provided, that is to say a specific illumination angle distribution. Said illumination setting corresponds to a specific intensity distribution of the illumination light 1 in an illumination pupil of the illumination optical unit of the illumination system 4. A pupil stop 7 arranged in a pupil plane 8 of the illumination optical unit 6 serves to provide the respective illumination setting.

The pupil stop 7 is held in a stop holder 7a. This may be a quick-change stop holder which facilitates a replacement of the pupil stop 7 currently used in the illumination with at least one change pupil stop. Such a quick-change holder can comprise a cartridge having a plurality of pupil stops 7, in particular different pupil stops, for specifying various illumination settings.

An image-side numerical aperture of the imaging optical unit 3 is 0.7. Depending on the embodiment of the imaging optical unit 3, the image-side numerical aperture is greater than 0.5 and can also be 0.55, 0.6, 0.65, 0.75, 0.8 or even greater. This image-side numerical aperture of the imaging optical unit 3 is adapted to the image-side numerical aperture of the production projection exposure apparatus to be simulated by the imaging by the metrology system. Accordingly, the illumination setting set by the dipole pupil stop 7 is also adapted to a production illumination setting of this production projection exposure apparatus.

Figure 2:
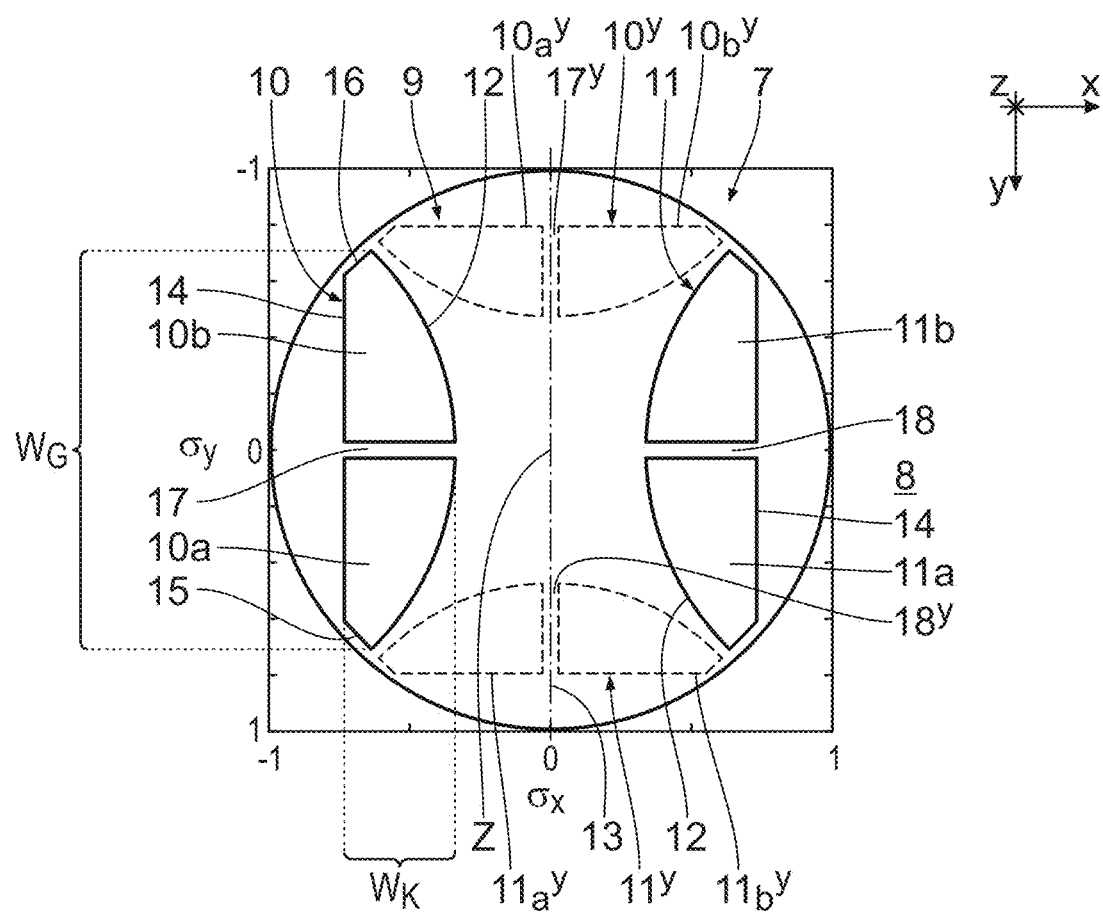
FIG. 2 shows a plan view of a dipole pupil stop for an illumination optical unit of the metrology system.

FIG. 2 shows an embodiment of the pupil stop 7, which is designed as a dipole pupil stop, in an xy-plan view. A usable pupil 9 of the illumination optical unit 6 is indicated in FIG. 2 by a circular edge. This maximally usable pupil 9 may have a circular edge but may also have an edge for example deviating from a circular form, for example an elliptical edge. The pupil coordinates that span the pupil, which correspond to the x and y coordinates directions, are also referred to as $\sigma_x$, $\sigma_y$ below. These pupil coordinates $\sigma_x$, $\sigma_y$ are normalized such that the maximally usable pupil 9 respectively covers the value range of [−1, 1] in the two coordinates $\sigma_x$, $\sigma_y$.

The dipole pupil stop 7 has two pole passage openings 10, 11, the entire outer contour of which is approximately segment shaped. The pole passage opening 10 to the left in FIG. 2 has a partial circle-shaped edge portion 12, which bulges toward a center Z of the pupil 9.

Edge contours of the pole passage openings 10, 11 are mirror symmetrical in relation to a plane of symmetry 13 which is parallel to the yz-plane and which has a coordinate of $\sigma_x=0$, and so it is sufficient to describe the edge form of one of the two pole passage openings 10, 11 below.

The two pole passage openings 10, 11 serve to specify a respective pole of a dipole illumination of the illumination optical unit 6 specified by the dipole pupil stop 7. The illumination light 1 can pass through the pupil plane 8 by way of the two pole passage openings 10, 11. The illumination light 1 is blocked by the dipole pupil stop 7 away from the pole passage openings 10, 11. This blocking can be implemented by absorption and/or reflection and/or scattering of the illumination light 1.

An edge portion 14 of the pole passage opening 10 opposite the edge portion 12 in the direction of the negative $\sigma_x$-coordinate has a rectilinear design and extends approximately at the coordinate $\sigma_x=0.75$.

In the region of maximum positive and negative $\sigma_x$-coordinates, the two edge portions 12, 14 abut one another not by way of a sharp corner but by way of a bevel portion 15, 16. These bevel portions 15, 16 are short in comparison with the other edge portions 12, 14 and are located in the region of the +0.7 and −0.7 $\sigma_x$-coordinates.

Each pole passage opening 10, 11 has a stop web 17, 18, which passes through the respective pole passage opening 10, 11 and consequently divides the respective pole passage opening 10, 11 into a plurality of partial pole openings, specifically two partial pole openings 10a, 10b and 11a, 11b.

The two stop webs 17, 18 extend along the $\sigma_x$-coordinate level with the $\sigma_y=0$ coordinate. On account of the mirror symmetry of the pole passage openings 10, 11, the stop webs 17, 18 also extend symmetrically with respect to the plane of symmetry 13, in which the center Z of the pupil 9 is located. The center Z of the pupil 9 coincides with a center, that is to say a stop centroid, of the dipole pupil stop 7.

In the embodiment according to FIG. 2, exactly one stop web 17, 18 is assigned to each pole passage opening 10, 11. That is to say, exactly one stop web 17, 18 is arranged in each pole passage opening 10, 11.

In the pupil plane 8, that is to say in an arrangement plane of the dipole pupil stop 7, the pole passage openings 10, 11 have a greater aperture width $W_G$ along the $\sigma_y$-coordinate and have a second, smaller aperture width $W_K$ along the pupil coordinate $\sigma_x$ perpendicular thereto. A pupil coordinate extent $\sigma_x$ is approximately 1.4 (−0.7 to +0.7) for the larger aperture width $W_G$ and, in the case of the smaller aperture width $W_K$, the aperture width in the direction of the ac pupil coordinate is approximately 0.4 (−0.8 to −0.4 or +0.4 to +0.8). An aspect ratio between the greater aperture width $W_G$ and the smaller aperture width $W_K$ is approximately 3.5, and is therefore greater than 2.

The stop webs 17, 18 each extend along the smaller aperture width $W_K$.

A thickness of the stop webs 17, 18 in the direction of the $\sigma_y$ pupil coordinate is approximately 0.05 ($\sigma_y$=−0.025 to +0.025).

The two pole passage openings 10, 11 specify an x-dipole, that is to say an x-dipole illumination setting of the illumination optical unit 6. Thus, the x-direction is a dipole direction of this setting. The stop webs 17, 18 extend along this dipole direction x.

The two pole passage openings 10, 11 are spaced apart from one another along the dipole direction x, to be precise, expressed in values of the a-coordinate, by approximately 0.8 ($\sigma_x$=−0.4 to +0.4).

Instead of an x-dipole, a pupil stop in the style of the dipole pupil stop 7 may also be embodied as a quadrupole pupil stop, for example in the style of a C-quad. An embodiment of a C-quad with non-divided pole passage openings is known from FIG. 3a in WO 2012/028303 A1.

In FIG. 2, the two additional pole passage openings 10$^y$, 11$^y$ which yield a corresponding C-quad pupil stop together with the two pole passage openings 10, 11 are indicated using dashed lines. The two additional pole passage openings 10$^y$, 11$^y$ are also each divided into two partial pole openings 10$_a^y$, 10$_b^y$ and 11$_a^y$, 11$_b^y$, respectively, as explained above in conjunction with the pole passage openings 10 and 11 of the dipole pupil stop 7. What was already explained in relation to the pole passage openings 10, 11 and to their stop webs 17, 18 applies with regard to the geometry of the pole passage openings 10$^y$, 11$^y$ and the associated stop webs 17, 18, which then extend along the $\sigma_y$-coordinate. The two stop webs 17$^y$, 18$^y$ extend along the $\sigma_y$-coordinate level with the $\sigma_x$=0 coordinate.

Figure 3:
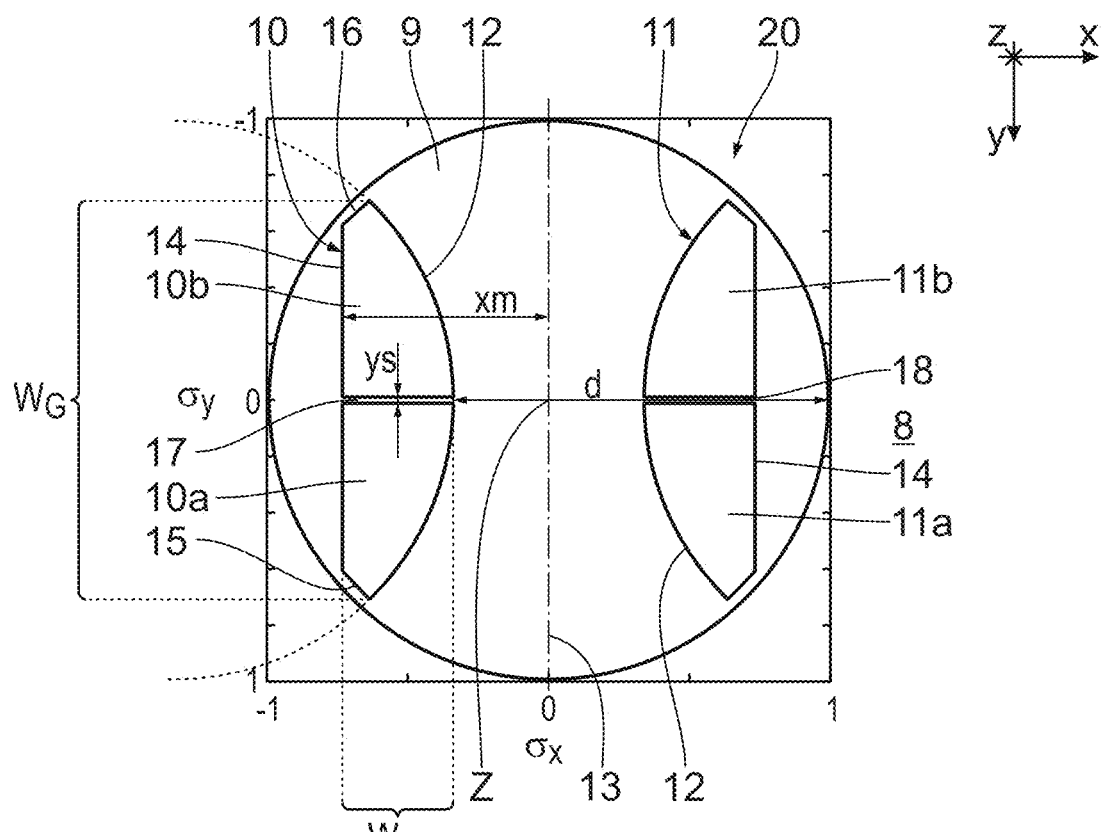
FIG. 3 shows, in a representation similar to FIG. 2, a further embodiment of the dipole pupil stop, with moreover parameters for characterizing position and size of pole passage openings of the dipole pupil stop being depicted.

FIG. 3 shows a further embodiment of a dipole pupil stop 20 that can be used instead of the dipole pupil stop.

Below, the dipole pupil stop 20 is only described where it differs from the dipole pupil stop 7. Component parts and functions which were already explained above in conjunction with the pupil stop 7 have the same reference signs and are not discussed again in detail.

In the case of the dipole pupil stop 20, the stop webs 17, 18 have a smaller $\sigma_y$-extent, which is approximately half the $\sigma_y$-extent of the stop webs 17, 18 in the embodiment according to FIG. 2.

Moreover, FIG. 3 specifies a few parameters for measuring the relative positions of the pole passage openings 10, 11 of the pupil stop 20.

ys denotes the extent of the stop webs 17, 18 in the $\sigma_y$-direction.

xm denotes the distance between the rectilinear edge portion 14 and the center coordinate $\sigma_x$=0.

d denotes a distance between the partial circle-shaped edge portion 12 of the pole passage opening 10 and the most distant pupil point with the $\sigma_x/\sigma_x$-coordinates [1, 0].

The metrology system 2 is used as follows: Initially, the imaging optical unit 3 on the one hand and—by way of the respective pupil stop 7 or 20 on the other hand—an image-side numerical aperture, and an illumination setting are set, the latter corresponding to the best possible extent to the illumination and imaging conditions of a production projection exposure apparatus to be measured.

With the illumination setting that is respectively set, the illumination light 1 illuminates an object field 21 of an object plane 22 of the metrology system 2. Thus, a lithography mask 23, which is also referred to as a reticle, is arranged in the object plane 22 as an object to be illuminated during the production as well. Above the object plane 22, which extends parallel to the xy-plane, a structure section of the lithography mask 23 is shown schematically in FIG. 1. This structure section is represented in such a way that it lies in the plane of the drawing of FIG. 1. The actual arrangement of the lithography mask 23 is perpendicular to the plane of the drawing of FIG. 1 in the object plane 22.

The illumination light 1 is reflected from the lithography mask 23, as depicted schematically in FIG. 1, and enters an entrance pupil 24 of the imaging optical unit 3 in an entrance pupil plane 25. The utilized entrance pupil 24 of the imaging optical unit 3 is round or, as schematically indicated in FIG. 1, has an elliptic edge.

Within the imaging optical unit 3, the illumination or imaging light 1 propagates between the entrance pupil plane 25 and an exit pupil plane 26. A circular exit pupil 27 of the imaging optical unit 3 lies in the exit pupil plane 26. The imaging optical unit 3 can have an anamorphic embodiment and generates the circular exit pupil 27 from the round or elliptic entrance pupil 8.

The imaging optical unit 3 images the object field 21 into a measurement or image field 28 in an image plane 29 of the projection exposure apparatus 2. Below the image plane 29, FIG. 1 schematically shows an imaging light intensity distribution I which is measured in a plane spaced apart from the image plane 29 by a value $z_W$ in the z-direction, i.e., an imaging light intensity at a defocus value $z_W$.

The imaging light intensities I (x, y, $z_W$) at the various z-values around the image plane 29 are also referred to as a 3D aerial image of the projection exposure apparatus 2.

A spatially resolving detection device 30, which can be a CCD camera or a CMOS camera, is arranged in the image plane 29, which represents a measurement plane of the metrology system 2. The detection device 30 registers the imaging light intensities I (x, y, $z_W$).

The imaging optical unit 3 can have a magnifying imaging scale greater than 100 when imaging the object field 21 into the image field 28. This imaging scale can be greater than 200, can be greater than 250, can be greater than 300, can be greater than 400, can be greater than 500. The imaging scale of the imaging optical unit 3 is regularly less than 2000.

The shadowing within the pole passage openings 10, 11 as a result of the stop webs 17, 18 leads to the dipole illumination within the metrology system 2 better corresponding to a corresponding dipole illumination of the production system to which there should be convergence in respect of the illumination and imaging conditions. Surprisingly, this applies despite the fact that the production system lacks corresponding webs or shadowing within the poles of the dipole illumination.

In particular, good correspondence can be achieved in respect of a NILS (normalized image log slope, derivative of an aerial image intensity curves at an edge position of an imaged structure) parameter. With regard to the definition of this NILS parameter, reference is made to US 2015/0042974 A1, herein incorporated by reference.

It is also possible to reduce deviations (ΔCD) between the critical dimensions (CD) which are able to be imaged firstly with the imaging optical unit of the metrology system and secondly with the imaging optical unit of the production system. These deviations are typically specified normalized to the critical dimension that can be imaged by the production system. The reduction in the deviation applies, in particular, to the value $\Delta CD_V$, that is to say to the change in the critical dimension in the case of structures extending vertically (in the y-direction). In particular, the value $\Delta CD_V$ can be better than 5%.

In the context of the definition of the parameter CD, reference is made to U.S. Pat. No. 9,176,390 B, herein incorporated by reference.

Particularly deviations in a proportionality between a change in the critical dimension on the wafer in relation to the change in the critical dimension on the mask:

$$MEEF = \Delta CD_{Wafer}/\Delta CD_{Mask}$$

can be advantageously reduced by the use of the dipole pupil stop 7 or 20.

The normalized value:

$$\Delta MEEF = \frac{MEEF_{AIMS} - MEEF_{Scanner}}{MEEF_{Scanner}}$$

can advantageously be kept small.

This applies, in particular, to the vertical component $\Delta MEEF_V$, which can be kept smaller than 20%, smaller than 15% and even smaller than 10%. A measuring error $\Delta CD$ of the metrology system 2 of 1% of the critical target dimension arises for a value $\Delta MEEF$ of 10% and a minimum resolvable defect size $\Delta CD=10\%$ of a critical target dimension.

While this specification contains many implementation details, these should not be construed as limitations on the scope of the invention or of what can be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments. Moreover, although features can be described above as acting in certain combinations and even initially claimed as such, one or more features from a claimed combination can in some cases be excised from the combination, and the claimed combination can be directed to a subcombination or variation of a subcombination.

Thus, particular embodiments of the invention have been described. Other embodiments are within the scope of the following claims.

What is claimed is:

1. A pupil stop for an illumination optical unit of a metrology system for determining, as a result of illumination and imaging under illumination and imaging conditions corresponding to those of an optical production system, an aerial image of an object to be measured,
    comprising at least two pole passage openings for specifying a respective pole of a multipole illumination of the illumination optical unit specified by the pupil stop,
    comprising in each case at least one stop web, which passes through the respective pole passage opening and consequently divides the pole passage opening into a plurality of partial pole openings.

2. The pupil stop of claim 1, wherein the stop webs are arranged symmetrically with respect to a center of the pupil stop.

3. The pupil stop of claim 2, wherein exactly one stop web is arranged in each pole passage opening.

4. The pupil stop of claim 2, wherein the pole passage openings each have a first, greater aperture width ($W_G$) and a second, smaller aperture width ($W_K$) in two mutually perpendicular directions ($\sigma_y$, $\sigma_x$) in an arrangement plane, an aspect ratio ($W_G/W_K$) between the greater aperture width ($W_G$) and the smaller aperture width ($W_K$) being greater than 2, with the stop webs in each case extending along the second, smaller aperture width ($W_K$).

5. The pupil stop of claim 2, wherein two of the pole passage openings are spaced apart from one another along a dipole direction (x), the stop webs extending along the dipole direction (x).

6. The pupil stop of claim 1, wherein exactly one stop web is arranged in each pole passage opening.

7. The pupil stop of claim 6, wherein the pole passage openings each have a first, greater aperture width ($W_G$) and a second, smaller aperture width ($W_K$) in two mutually perpendicular directions ($\sigma_y$, $\sigma_x$) in an arrangement plane, an aspect ratio ($W_G/W_K$) between the greater aperture width ($W_G$) and the smaller aperture width ($W_K$) being greater than 2, with the stop webs in each case extending along the second, smaller aperture width ($W_K$).

8. The pupil stop of claim 6, wherein two of the pole passage openings are spaced apart from one another along a dipole direction (x), the stop webs extending along the dipole direction (x).

9. The pupil stop of claim 1, wherein the pole passage openings each have a first, greater aperture width ($W_G$) and a second, smaller aperture width ($W_K$) in two mutually perpendicular directions ($\sigma_y$, $\sigma_x$) in an arrangement plane, an aspect ratio ($W_G/W_K$) between the greater aperture width ($W_G$) and the smaller aperture width ($W_K$) being greater than 2, with the stop webs in each case extending along the second, smaller aperture width ($W_K$).

10. The pupil stop of claim 1, wherein two of the pole passage openings are spaced apart from one another along a dipole direction (x), the stop webs extending along the dipole direction (x).

11. An illumination optical unit of a metrology system for determining, as a result of illumination and imaging under illumination and imaging conditions corresponding to those of an optical production system, an aerial image of an object to be measured, comprising a pupil stop according to claim 1.

12. A metrology system for determining, as a result of illumination and imaging under illumination and imaging conditions corresponding to those of an optical production system, an aerial image of an object to be measured, comprising
    an illumination optical unit according to claim 11,
    an imaging optical unit for imaging a portion of the object into a measurement plane, and
    a spatially resolving detection device, arranged in the measurement plane.

13. The metrology system of claim 12, wherein the imaging optical unit has an image-side numerical aperture which is greater than 0.5.

14. The metrology system of claim 12, wherein the stop webs are arranged symmetrically with respect to a center of the pupil stop.

15. The metrology system of claim 12, wherein exactly one stop web is arranged in each pole passage opening.

16. The metrology system of claim 12, wherein the pole passage openings each have a first, greater aperture width ($W_G$) and a second, smaller aperture width ($W_K$) in two mutually perpendicular directions ($\sigma_y$, $\sigma_x$) in an arrangement plane, an aspect ratio ($W_G/W_K$) between the greater aperture width ($W_G$) and the smaller aperture width ($W_K$) being greater than 2, with the stop webs in each case extending along the second, smaller aperture width ($W_K$).

17. The metrology system of claim 12, wherein two of the pole passage openings are spaced apart from one another along a dipole direction (x), the stop webs extending along the dipole direction (x).

18. The illumination optical unit of claim 11, wherein the stop webs are arranged symmetrically with respect to a center of the pupil stop.

19. The illumination optical unit of claim 11, wherein exactly one stop web is arranged in each pole passage opening.

20. The pupil stop of claim 1, wherein the stop web has a constant transverse dimension across its web extension.

* * * * *

UNITED STATES PATENT AND TRADEMARK OFFICE
CERTIFICATE OF CORRECTION

| | |
|---|---|
| PATENT NO. | : 11,531,272 B2 |
| APPLICATION NO. | : 17/724701 |
| DATED | : December 20, 2022 |
| INVENTOR(S) | : Matthias Roesch |

It is certified that error appears in the above-identified patent and that said Letters Patent is hereby corrected as shown below:

In the Specification

<u>Column 4</u>
Line 67, delete "ac pupil" and insert -- $\sigma_x$ pupil --

<u>Column 5</u>
Line 17, delete "a-coordinate," and insert -- $\sigma_x$-coordinate, --

Signed and Sealed this
Twenty-first Day of February, 2023

Katherine Kelly Vidal
*Director of the United States Patent and Trademark Office*